(12) United States Patent
Cho et al.

(10) Patent No.: US 12,460,991 B2
(45) Date of Patent: Nov. 4, 2025

(54) PHOTOMASK INSPECTION APPARATUS AND METHOD OF INSPECTING PHOTOMASK USING THE SAME

(71) Applicants: Samsung Display Co., Ltd., Yongin-si (KR); HIMS CO., LTD., Incheon (KR)

(72) Inventors: Chanhyeong Cho, Yongin-si (KR); Tae Joon Kim, Yongin-si (KR); Jeongmin Park, Yongin-si (KR); Hyeonguk Yeo, Yongin-si (KR); Juil Kim, Incheon (KR); Daehoon Min, Incheon (KR)

(73) Assignees: SAMSUNG DISPLAY CO., LTD., Gyeonggi-do (KR); HIMS CO., LTD., Incheon (KR)

( * ) Notice: Subject to any disclaimer, the term of this patent is extended or adjusted under 35 U.S.C. 154(b) by 184 days.

(21) Appl. No.: 18/225,534

(22) Filed: Jul. 24, 2023

(65) Prior Publication Data
US 2024/0044741 A1    Feb. 8, 2024

(30) Foreign Application Priority Data
Aug. 5, 2022    (KR) .......................... 10-2022-0097829

(51) Int. Cl.
*G01M 11/02*    (2006.01)
*G03F 7/00*    (2006.01)

(52) U.S. Cl.
CPC ..... *G01M 11/0257* (2013.01); *G03F 7/70441* (2013.01); *G03F 7/7065* (2013.01)

(58) Field of Classification Search
CPC ............. G01M 11/0257; G03F 7/7065; G03F 7/70441
See application file for complete search history.

(56) References Cited

U.S. PATENT DOCUMENTS 4,508,453 A * 4/1985 Hara ..................... G03F 7/7065
                                                                            348/126
9,891,525 B2    2/2018 Yabu
(Continued)

FOREIGN PATENT DOCUMENTS

KR    1020070098695 A    10/2007
KR      101070558 B1    10/2011
(Continued)

*Primary Examiner* — Georgia Y Epps
*Assistant Examiner* — Don J Williams
(74) *Attorney, Agent, or Firm* — CANTOR COLBURN LLP

(57) ABSTRACT

A photomask inspection apparatus includes a stage which supports an inspection substrate, a first optical system having a first numerical aperture and disposed at one side of the inspection substrate, a second optical system having a second numerical aperture, spaced apart from the first optical system, and disposed at the one side of the inspection substrate, an imaging optical system including a first objective lens aligned with the first optical system with the inspection substrate disposed therebetween, a second objective lens aligned with the second optical system with the inspection substrate disposed therebetween, and disposed at another side of the inspection substrate, which is opposite to the one side of the inspection substrate, and a camera which captures an image passed through the imaging optical system. The first numerical aperture is greater than the second numerical aperture.

16 Claims, 3 Drawing Sheets

(56) References Cited

U.S. PATENT DOCUMENTS

| | | | |
|---|---|---|---|
| 10,042,248 B2 | 8/2018 | Degünther et al. | |
| 2002/0152451 A1* | 10/2002 | Shi | G03F 7/70441 |
| | | | 716/53 |
| 2008/0049222 A1* | 2/2008 | Yamaguchi | G01B 11/0625 |
| | | | 356/328 |
| 2009/0213349 A1* | 8/2009 | Renwick | G03F 7/70458 |
| | | | 355/75 |
| 2011/0157692 A1* | 6/2011 | Lin | G01N 21/645 |
| | | | 359/387 |
| 2017/0200658 A1 | 7/2017 | Yang et al. | |
| 2021/0164916 A1* | 6/2021 | Liu | G06T 7/0004 |

FOREIGN PATENT DOCUMENTS

| | | |
|---|---|---|
| KR | 101216803 B1 | 12/2012 |
| KR | 1020150131036 A | 11/2015 |
| KR | 1020170083678 A | 7/2017 |
| KR | 101889837 B1 | 8/2018 |

* cited by examiner

PHOTOMASK INSPECTION APPARATUS AND METHOD OF INSPECTING PHOTOMASK USING THE SAME

This application claims priority to Korean Patent Application No. 10-2022-0097829, filed on Aug. 5, 2022, and all the benefits accruing therefrom under 35 U.S.C. § 119, the content of which in its entirety is herein incorporated by reference.

BACKGROUND

1. Field

The disclosure relates to a photomask inspection apparatus and a method of inspecting a photomask using the photomask inspection apparatus.

2. Description of the Related Art

A photolithography process may be performed using a photomask to form a circuit pattern or a line in a process of manufacturing a semiconductor chip or a display panel. The photomask for the display panel, which is used in the photolithography process, is used as a negative film to form the circuit pattern or the line in a large glass substrate.

SUMMARY

In a photolithography process using a photomask, when foreign substances are attached to the photomask or an exposure process is carried out using a photomask with defects, defects occur in a circuit pattern to be formed on a substrate, and thus, defects are caused in semi-finished products produced in the subsequent processes. Accordingly, it is desired to inspect the photomask for defects such as abnormality or adhesion of foreign substances, and to inspect the circuit pattern of the display panel manufactured by using the defective photomask in the photolithography process.

The disclosure provides a photomask inspection apparatus capable of inspecting not only defects of a photomask itself such as abnormality or adhesion of foreign substances but also possible defects of a semi-finished substrate formed through a photolithography process through an emulation in advance in a same apparatus.

The disclosure provides a method of inspecting the photomask using the photomask inspection apparatus.

Embodiments of the invention provide a photomask inspection apparatus including a stage which supports an inspection substrate, a first optical system having a first numerical aperture and disposed at one side of the inspection substrate, a second optical system having a second numerical aperture, spaced apart from the first optical system, and disposed at the one side of the inspection substrate, an imaging optical system including a first objective lens aligned with the first optical system with the inspection substrate disposed therebetween, a second objective lens aligned with the second optical system with the inspection substrate disposed therebetween, and disposed at another side of the inspection substrate, which is opposite to the one side of the inspection substrate, and a camera which captures an image passed through the imaging optical system. In such embodiments, the first numerical aperture is greater than the second numerical aperture.

In an embodiment, the first optical system may include a first light source, a first light guide, a first aperture, and a first illumination lens having the first numerical aperture.

In an embodiment, the first optical system may include a first light source, the second optical system may include a second light source, and a light radiated from the first light source and a light radiated from the second light source may have different wavelengths from each other.

In an embodiment, the light radiated from the first light source may have a wavelength equal to or greater than about 365 nanometers (nm) and equal to or smaller than about 405 nm.

In an embodiment, the second optical system may include a second light source, a second light guide, a beam shaper, an off-axis illumination, a second aperture, and a second illumination lens having the second numerical aperture.

In an embodiment, the imaging optical system may include a third light source, a third light guide, a condenser lens, a third aperture connected to the first objective lens and the second objective lens, a body tube, and a tube lens which increases a magnification and is connected to the camera.

In an embodiment, the first objective lens may have a numerical aperture corresponding to the first numerical aperture, and the second objective lens may have a numerical aperture corresponding to the second numerical aperture.

In an embodiment, the first numerical aperture may be equal to or greater than about 0.4 and equal to or less than about 0.6.

In an embodiment, the second numerical aperture may be equal to or greater than about 0.05 and equal to or less than about 0.35.

In an embodiment, the inspection substrate may be a photomask used in a photolithography process.

In an embodiment, the photomask may be a phase shift mask (PSM) or a photomask to which an optical proximity correction (OPC) is applied.

In an embodiment, the first optical system may employ a critical illumination scheme, and the second optical system may employ a Kohler Illumination scheme.

In an embodiment, a light provided from the second optical system and passed through the inspection substrate may be projected on the camera as a shape corresponding to a circuit pattern patterned using the photomask in a photolithography process.

Embodiments of the invention provide a method of inspecting a photomask. The inspection method of the photomask includes primarily inspecting a first image projected through the photomask by radiating a light from a first optical system to the photomask, and secondarily inspecting a second image projected through the photomask by radiating a light from a second optical system to the photomask. In such embodiments, the first optical system has a higher resolution than the second optical system, and the primarily inspecting and the secondarily inspecting are selectively performed in a same inspection apparatus.

In an embodiment, the primarily inspecting may include allowing the light radiated from the first optical system and passed through the photomask to be formed as the first image using an imaging optical system including a first objective lens, and capturing the first image using a camera.

In an embodiment, the secondarily inspecting may include allowing the light radiated from the second optical system and passed through the photomask to be formed as the second image using the imaging optical system further including a second objective lens, and capturing the second image using the camera. In such an embodiment, the second objective lens may have a numerical aperture smaller than a numerical aperture of the first objective lens.

According to embodiments of the invention, the photomask inspection apparatus is capable of inspecting defects of the photomask itself using the optical system with high resolution.

According to such embodiments, the photomask inspection apparatus is capable of inspecting possible defects occurring when an exposure process is performed using an optical system having specifications similar to specifications of an optical system used in an exposure machine in advance.

BRIEF DESCRIPTION OF THE DRAWINGS

The above and other features of the disclosure will become more apparent by describing in further detail embodiments thereof with the accompanying drawings, in which.

DETAILED DESCRIPTION

Figure 1:
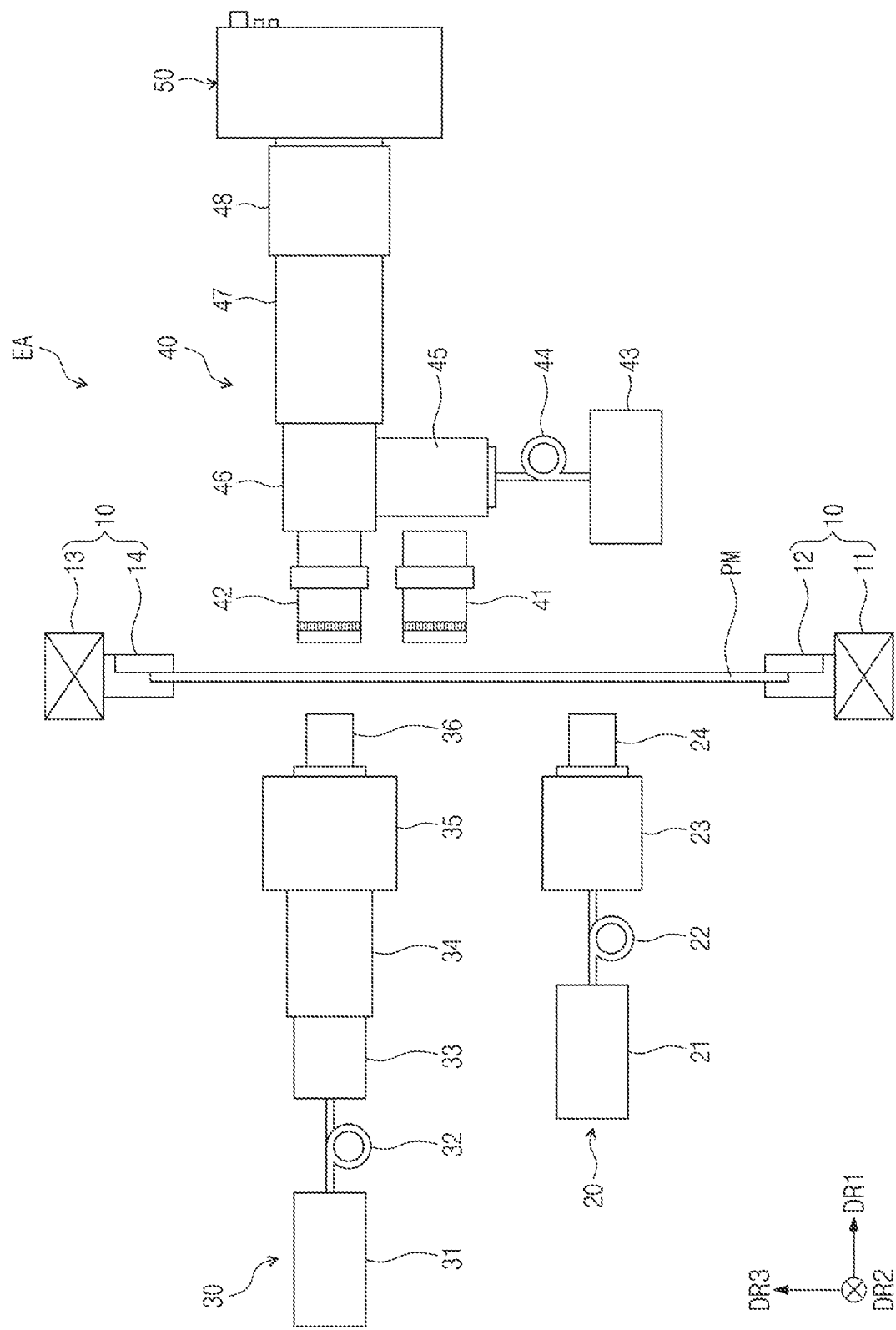
FIG. 1 is a block diagram of a photomask inspection apparatus according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be further understood that the terms "comprises" and/or "comprising," or "include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the disclosure will be described in detail with reference to the accompanying drawings.

Figure 2:
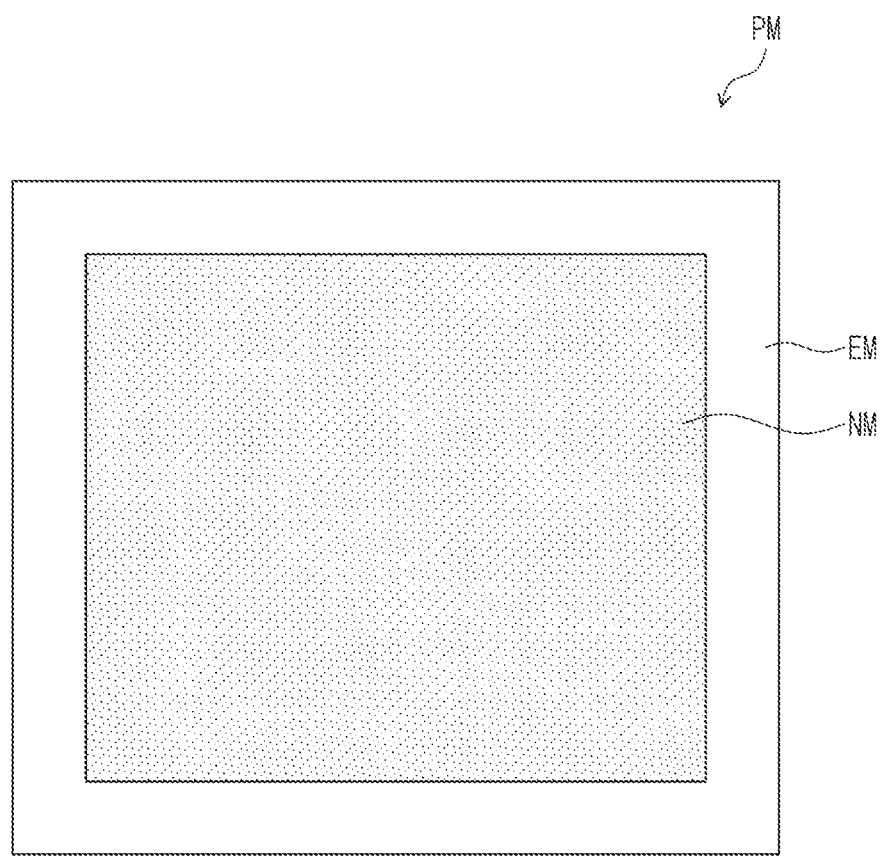
FIG. 2 is a plan view of a photomask according to an embodiment of the disclosure.
Figure 3A:
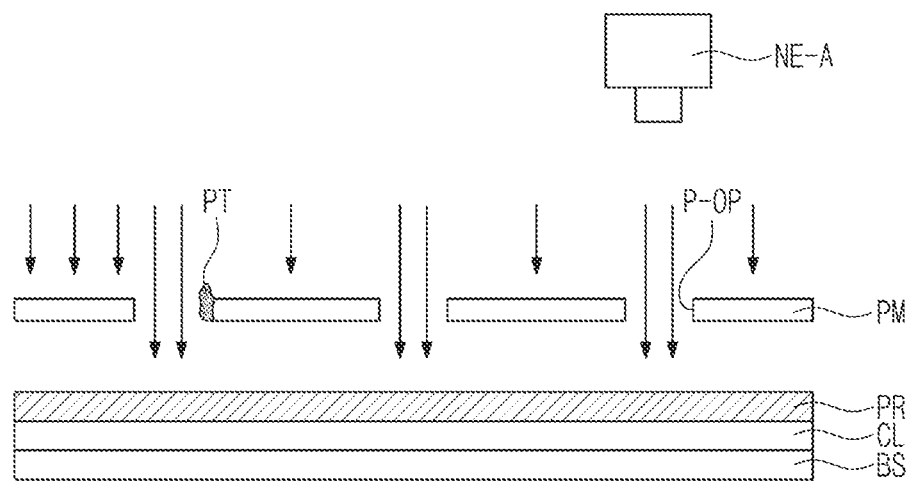
FIG. 3A is a cross-sectional view of a photolithography process using a photomask according to an embodiment of the disclosure.
Figure 3B:
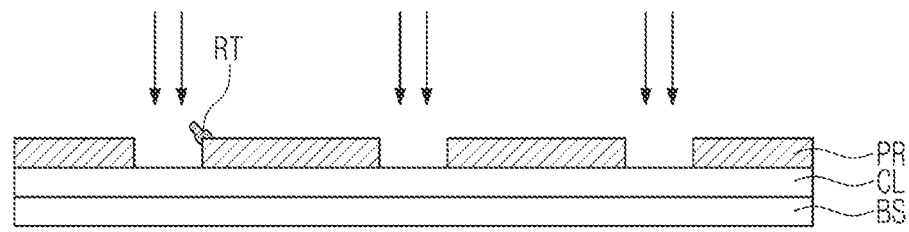
FIG. 3B is a cross-sectional view of a photolithography process using a photomask according to an embodiment of the disclosure.
Figure 3C:
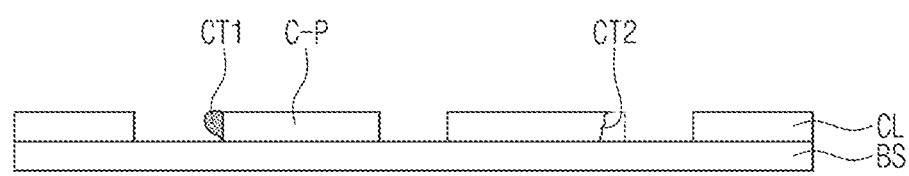
FIG. 3C is a cross-sectional view of a photolithography process using a photomask according to an embodiment of the disclosure.

FIG. 1 is a block diagram of a photomask inspection apparatus EA according to an embodiment of the disclosure. FIG. 2 is a plan view of a photomask according to an embodiment of the disclosure. FIGS. 3A to 3C are cross-sectional views of a photolithography process using the photomask PM according to an embodiment of the disclosure.

The photomask inspection apparatus EA may include a stage 10 for supporting an inspection substrate PM, a first optical system 20, a second optical system 30, an imaging optical system 40, and a camera 50. The first and second optical systems 20 and 30 of the photomask inspection apparatus EA may have different resolutions from each other. Details thereof will be described later.

The stage 10 may include a transfer unit 11 or 13 and a holder unit 12 or 14. The inspection substrate PM may be attached to the holder unit 12 or 14 and may be stably supported in the photomask inspection apparatus EA. The transfer unit 11 or 13 may be connected to a driving motor to reciprocate the inspection substrate PM in a second direction DR2. According to an embodiment of the disclosure, as the inspection substrate PM is vertically placed in the photomask inspection apparatus EA, the inspection substrate PM may be effectively prevented from sagging due to its own weight. Accordingly, the inspection for the inspection substrate PM may be more accurately performed.

The inspection substrate PM (hereinafter, also referred to as the photomask) may be a photomask used in a photolithography process. As a circuit pattern becomes fine, the photomask PM may be provided as a phase shift mask (PSM) or may be a photomask PM to which an optical proximity correction (OPC) is applied. The OPC is a photolithography enhancement technique commonly used to compensate for image errors due to diffraction or process effects by moving edges or adding extra polygons to the pattern written on the photomask.

Referring to FIG. 2, the photomask PM may include an exposure portion NM and an edge portion EM. The edge portion EM may surround at least a portion of the exposure portion NM. The edge portion EM may be a portion that is used to grip or transfer the photomask PM or that is coupled with other equipment during the photolithography process. The exposure portion NM may include a desired circuit pattern.

The photomask PM may have a quadrangular shape substantially parallel to each of the second direction DR2 and a third direction DR3, however, it should not be limited thereto or thereby. According to an alternative embodiment, the photomask PM may have a circular shape. In the disclosure, a first direction DR1, which is perpendicular to the second direction DR2 and the third direction DR3, may correspond to a thickness direction of the photomask PM.

Referring to FIGS. 3A to 3C, a conductive layer CL and a photoresist layer PR may be formed on a target substrate BS on which the photolithography process is performed. The exposure portion NM may be provided with openings P-OP defined therethrough to transmit a light provided from an exposure machine NE-A used in the photolithography process. The openings P-OP may be formed by removing portions of the photomask PM in the first direction DR1. An exposure process may be performed using the photomask PM, and then a development process and an etching process may be performed on the photoresist layer PR and the conductive layer CL, respectively. As a result, a circuit pattern C-P may be formed on the target substrate BS.

In a case where the exposure process is carried out using the photomask PM with defects due to a defect in the circuit pattern itself defining the openings P-OP of the photomask PM or a foreign substance adhering to the photomask PM during the photolithography process, the circuit pattern C-P of the target substrate BS may be defective, and defects may be caused in semi-finished products produced in the subsequent processes. Accordingly, an inspection for a critical dimension uniformity of the photomask PM or an inspection for defects of the photomask PM, such as an abnormality of a map of the photomask PM or an adhesion of a foreign matter, is desired.

In addition, as a resolution of display panels included in electronic devices increases, a width of lines formed by the photolithography process may decrease. The exposure machine NE-A used in the photolithography process provides a light in a short wavelength band to reduce the width of the circuit pattern or lines used in high-resolution products. In this case, even though there is no defect in the photomask PM, a periphery of the circuit pattern C-P may be distorted due to an interference by diffraction and scattering phenomenon caused by the radiation of the light in the short wavelength band.

FIGS. 3A to 3C show a first defect CT1 of the circuit pattern C-P caused by the defect of the photomask PM itself and a second defect CT2 of the circuit pattern C-P, which occurs as the process is performed using the exposure machine NE-A that provides the light in the short wavelength band as a representative example.

The defect PT formed in the photomask PM may cause a chain of defects in the photolithography process. As an example, the defect PT of the photomask PM may appear as a defect RT of the photoresist layer PR in the development process for the photoresist layer PR after the exposure process, and the defect RT may appear as the first defect CT1 of the circuit pattern C-P in the etching process of the conductive layer CL using the photoresist layer PR.

Even though there is no defect in the circuit pattern formed in the photomask PM, when the exposure process is carried out using the exposure machine NE-A with the light in the short wavelength band, the second defect CT2 may occur in the circuit pattern C-P due to the interference caused by the diffraction and scattering phenomenon after the development process and the etching process are carried out.

Accordingly, the photomask inspection apparatus is desired to include an optical system that inspects the defect of the photomask PM and an optical system similar to that used in the exposure machine NE-A.

For the convenience of illustration and description, FIG. 3C shows one target substrate BS in which both the first defect CT1 and the second defect CT2 appear, however, only one of the first defect CT1 and the second defect CT2 may appear in the target substrate BS.

Referring back to FIG. 1, the first optical system 20 may be disposed at one side of the inspection substrate PM. The one side of the inspection substrate PM may correspond to a front surface of the inspection substrate PM. According to an embodiment of the disclosure, the first optical system 20 may employ a critical illumination scheme.

The first optical system 20 may include a first light source 21, a first light guide 22, a first aperture 23, and a first illumination lens 24. The first light source 21 may provide a light to the first light guide 22. The first light source 21 may employ an ultraviolet (UV) light emitting diode (LED) or a laser light source. The light provided from the first light source 21 may have a wavelength equal to or greater than about 365 nanometers (nm) and equal to or smaller than about 405 nm. The light provided from the first light source 21 may be incident into the first aperture 23 through the first light guide 22, an intensity of the light may be adjusted by the first aperture 23, and then, the light whose intensity is adjusted may be radiated to the inspection substrate PS after passing through the first illumination lens 24.

The first illumination lens 24 may have a predetermined first numerical aperture. In an embodiment of the embodiment, the first numerical aperture may be equal to or greater than about 0.4 and equal to or less than about 0.6. Accordingly, in such an embodiment, the first optical system 20 may be a high resolution optical system.

The second optical system 30 may be disposed at the one side of the inspection substrate PM. The second optical system 30 and the first optical system 20 may be coupled with one head and may be disposed at a same side of the inspection substrate PM, and the first optical system 20 and the second optical system 30, which are connected to the one head, may be selectively (or moved to be) disposed at the one side of the inspection substrate PM by a robot arm or a motor. The first optical system 20 and the second optical system 30 may reciprocate along the third direction DR3 with respect to the inspection substrate PM.

According to an embodiment of the disclosure, as the inspection substrate PM horizontally reciprocates along the transfer unit 11 or 13 in the second direction DR2 and the first optical system 20 and the second optical system 30 are coupled with the head to vertically reciprocate along the inspection substrate PM in the third direction DR3, an entire area of the inspection substrate PM may be inspected. Accordingly, an inspection accuracy of the photomask inspection apparatus EA may be improved.

The second optical system 30 may be similar to an optical system applied to the exposure machine NE-A used in the exposure process. The second optical system 30 may employ a Kohler Illumination scheme.

The second optical system 30 may include a second light source 31, a second light guide 32, a beam shaper 33, an off-axis illumination 34, a second aperture 35, and a second illumination lens 36.

The second light source 31 may provide a light to the second light guide 32. The second light source 31 may employ a UV LED or a laser light source. In an embodiment, the light provided from the second light source 31 may have a wavelength band similar to a wavelength band of the light provided from the exposure machine NE-A used in the exposure process. Accordingly, in such an embodiment, the light provided from the second light source 31 may have a short wavelength band.

The light provided from the second light source 31 may be incident into the beam shaper 33 via the second light guide 32. The beam shaper 33 may be the same lens as a fly-eye lens included in the exposure machine NE-A. The light exiting from the beam shaper 33 may be incident into the off-axis illumination 34. The light processed while passing through the off-axis illumination 34 may reach the second aperture 35, an intensity of the light may be adjusted by the second aperture 35, and then, the light whose intensity is adjusted may be radiated to the inspection substrate PS after transmitting through the second illumination lens 36.

The second illumination lens 36 may have a second numerical aperture less than the first numerical aperture of the first illumination lens 24. In an embodiment, the second numerical aperture may be equal to or greater than about 0.05 and equal to or less than about 0.35. Accordingly, such an embodiment, the second optical system 30 may be a low resolution optical system compared with the first optical system 20.

The second optical system 30 included in the photomask inspection apparatus EA may control an interference of the light such that the light provided to the imaging optical system 40 may be projected with the shape corresponding to the circuit pattern C-P formed using the photomask PM. As described above, when the photolithography process is carried out using the photomask PM inspected based on an emulated image, defects caused by the exposure machine NE-A emitting the light in the short wavelength band may be effectively detected in advance. Accordingly, as the photomask PM that may cause defects is removed after the exposure process, the cost and time spent for the subsequent process may be reduced.

The imaging optical system 40 may be an optical system that guides the lights provided from the first optical system 20 and the second optical system 30 to form a projected image of the circuit pattern of the inspection substrate PM.

The imaging optical system 40 may be disposed at another side of the inspection substrate PM, which is opposite to the one side of the inspection substrate PM in the first direction DR1. The another side of the inspection substrate PM may correspond to a rear surface of the inspection substrate PM.

The imaging optical system 40 may include a first objective lens 41, a second objective lens 42, a third light source 43, a third light guide 44, a condenser lens 45, a third aperture 46, a body tube 47, and a tube lens 48. The third light source 43 of the imaging optical system 40 may provide a light to the third aperture 46. The light provided from the third light source 43 may have a wavelength equal to or greater than about 500 nm and equal to or less than about 700 nm. The third aperture 46 may include a prism placed therein to change a path of the light provided from the third light source 43.

According to an embodiment of the disclosure, the first objective lens 41 may be aligned with the first illumination lens 24 when the inspection is carried out using the first optical system 20. In this case, the light exiting from the first objective lens 41 may be incident into the third aperture 46. The first objective lens 41 may have a numerical aperture similar to the first numerical aperture of the first illumination lens 24.

The second objective lens 42 may be aligned with the second illumination lens 36 when the inspection is carried out using the second optical system 30. In this case, the light exiting from the second objective lens 42 may be incident into the third aperture 46. The second objective lens 42 may have a numerical aperture similar to a second numerical aperture of the second illumination lens 36. The first objective lens 41 and the second objective lens 42 may be selectively aligned with corresponding first and second optical systems 20 and 30 and may transmit the light passed through the inspection substrate PM. The light passed through the body tube 47 may be magnified through the tube lens 48 to provide a magnified image to the camera 50.

The camera 50 may be connected to the imaging optical system 40. The light from the first optical system 20 and transmitted through the inspection substrate PM or the light from the second optical system 30 and transmitted through the inspection substrate PM may pass through the imaging optical system 40 and may be formed as the image, and thus, the image magnified by the tube lens 48 may be photographed or captured by the camera 50.

In a state where the components of the photomask inspection apparatus EA are aligned to allow the light exiting from the first optical system 20 or the second optical system 30 to proceed to the camera 50 after sequentially passing through the inspection substrate PM and the imaging optical system 40, the inspection substrate PM may be entirely scanned by the horizontal reciprocal motion of the inspection substrate PM in the second direction DR2 and the vertical reciprocal motion of the first optical system 20 or the second optical system 30 in the third direction DR3. In the disclosure, the expression "components are aligned" means that components are optically aligned. In this case, the components are not necessarily collinear in the first direction DR1 as long as the light is normally incident by reflection or refraction.

The camera 50 may be a line scan camera capable of high-speed shooting or a stepper camera that moves while sequentially shooting a unit area, however, it should not be limited thereto or thereby. In addition, the camera 50 may further include a review camera with high magnification to take the magnified images.

Hereinafter, an embodiment of a method of inspecting the photomask will be described with reference to FIGS. 1 to 3C.

In an embodiment, the method of inspecting the photomask may include a primary inspection and a secondary inspection.

The primary inspection may include aligning the first illumination lens 24 of the first optical system 20 with the first objective lens 41 of the imaging optical system 40, transmitting the light provided from the first optical system 20 through the photomask PM, and capturing a first image of the light projected on the first objective lens 41 using the camera 50. As the first optical system 20 used in the primary inspection employs the high resolution optical system, the inspection may be carried out to determine whether the photomask PM is defective or a foreign substance exists in the photomask PM.

The secondary inspection may include aligning the second illumination lens 36 of the second optical system 30 with the second objective lens 42 of the imaging optical system 40, transmitting the light provided from the second optical system 30 through the photomask PM, and capturing a second image of the light projected on the second objective lens 42 using the camera 50. As the second optical system 30 used in the secondary inspection may have specifications similar to those of the optical system used in the exposure machine NE-A, which provides the light in the short wavelength band, possible defects occurring when the exposure process is carried out using the light in the short wavelength band may be inspected through the emulation.

According to embodiments of the disclosure, the photomask inspection apparatus EA may inspect not only the defect of the photomask PM itself using the first optical system 20 with high resolution but also the possible defects occurring when the exposure process is performed with the light in the short wavelength band in advance using the second optical system 30 having the specifications similar to those of the optical system used in the exposure machine NE-A. Thus, defects that may occur in the subsequent process may be effectively detected in advance, and the process efficiency of the photomask inspection apparatus EA may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A photomask inspection apparatus comprising:
   a stage which supports an inspection substrate;
   a first optical system having a first numerical aperture and disposed at one side of the inspection substrate;
   a second optical system having a second numerical aperture, spaced apart from the first optical system, and disposed at the one side of the inspection substrate;
   an imaging optical system comprising a first objective lens aligned with the first optical system with the inspection substrate disposed therebetween, a second objective lens aligned with the second optical system with the inspection substrate disposed therebetween, and disposed at another side of the inspection substrate, which is opposite to the one side of the inspection substrate; and
   a camera which captures an image passed through the imaging optical system,
   wherein the first numerical aperture is greater than the second numerical aperture.

2. The photomask inspection apparatus of claim 1, wherein the first optical system comprises a first light source, a first light guide, a first aperture, and a first illumination lens having the first numerical aperture.

3. The photomask inspection apparatus of claim 1, wherein
   the first optical system comprises a first light source,
   the second optical system comprises a second light source, and
   a light radiated from the first light source and a light radiated from the second light source have different wavelengths from each other.

4. The photomask inspection apparatus of claim 3, wherein the light radiated from the first light source has a wavelength equal to or greater than about 365 nm and equal to or less than about 405 nm.

5. The photomask inspection apparatus of claim 1, wherein the second optical system comprises a second light source, a second light guide, a beam shaper, an off-axis illumination, a second aperture, and a second illumination lens having the second numerical aperture.

6. The photomask inspection apparatus of claim 1, wherein the imaging optical system comprises a third light source, a third light guide, a condenser lens, a third aperture connected to the first objective lens and the second objective lens, a body tube, and a tube lens which increases a magnification and is connected to the camera.

7. The photomask inspection apparatus of claim 6, wherein
   the first objective lens has a numerical aperture corresponding to the first numerical aperture, and
   the second objective lens has a numerical aperture corresponding to the second numerical aperture.

8. The photomask inspection apparatus of claim 7, wherein the first numerical aperture is equal to or greater than about 0.4 and equal to or less than about 0.6.

9. The photomask inspection apparatus of claim 7, wherein the second numerical aperture is equal to or greater than about 0.05 and equal to or less than about 0.35.

10. The photomask inspection apparatus of claim 1, wherein the inspection substrate is a photomask used in a photolithography process.

11. The photomask inspection apparatus of claim 10, wherein the photomask is a phase shift mask or a photomask to which an optical proximity correction is applied.

12. The photomask inspection apparatus of claim 1, wherein
   the first optical system employs a critical illumination scheme, and the second optical system employs a Köhler Illumination scheme.

13. The photomask inspection apparatus of claim 1, wherein a light provided from the second optical system and passed through the inspection substrate is projected on the camera as a shape corresponding to a circuit pattern to be patterned using the photomask in a photolithography process.

14. A method of inspecting a photomask, the method comprising:
   primarily inspecting a first image projected through the photomask by radiating a light from a first optical system to the photomask; and
   secondarily inspecting a second image projected through the photomask by radiating a light from a second optical system to the photomask,
   wherein the first optical system has a higher resolution than the second optical system, and the primarily inspecting and the secondarily inspecting are selectively performed in a same inspection apparatus.

15. The method of claim 14, wherein the primarily inspecting comprises:
   allowing the light radiated from the first optical system and passed through the photomask to be formed as the first image using an imaging optical system comprising a first objective lens; and
   capturing the first image using a camera.

16. The method of claim 15, wherein the secondarily inspecting comprises:
   allowing the light radiated from the second optical system and passed through the photomask to be formed as the second image using the imaging optical system further comprising a second objective lens; and
   capturing the second image using the camera,
   wherein the second objective lens has a numerical aperture less than a numerical aperture of the first objective lens.

* * * * *